(12) United States Patent
Sudo

(10) Patent No.: US 6,906,391 B2
(45) Date of Patent: Jun. 14, 2005

(54) SEMICONDUCTOR DEVICE HAVING SILICON OXIDE FILM

(75) Inventor: Shoji Sudo, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/453,566

(22) Filed: Jun. 4, 2003

(65) Prior Publication Data

US 2003/0230785 A1 Dec. 18, 2003

(30) Foreign Application Priority Data

Jun. 12, 2002 (JP) ........................................ 2002-171325

(51) Int. Cl.[7] .............................................. H01L 29/78
(52) U.S. Cl. ........................ 257/410; 257/411; 257/321
(58) Field of Search ................................ 257/410, 411, 257/321

(56) References Cited

U.S. PATENT DOCUMENTS

| | | | |
|---|---|---|---|
| 5,313,075 A | * 5/1994 | Zhang et al. ................... | 257/57 |
| 5,837,614 A | 11/1998 | Yamazaki et al. | |
| 5,854,505 A | * 12/1998 | Suzuki et al. ................ | 257/410 |
| 6,191,463 B1 | * 2/2001 | Mitani et al. ................ | 257/411 |

FOREIGN PATENT DOCUMENTS

| | | |
|---|---|---|
| JP | 04-157765 | 5/1992 |
| JP | 08-029314 | 2/1994 |
| JP | 06-169083 | 6/1994 |
| JP | 10-242310 | 9/1998 |
| JP | 10-256391 | 9/1998 |
| JP | P3234528 | 9/2001 |
| JP | 2002-509361 | 3/2002 |
| WO | WO 99/31732 | 6/1999 |

* cited by examiner

*Primary Examiner*—Jerome Jackson
(74) *Attorney, Agent, or Firm*—McDermott Will & Emery LLP

(57) ABSTRACT

A semiconductor device whose working life can be improved is obtained. This semiconductor device comprises a first conductive layer, a second conductive layer and a silicon oxide film, formed between the first and second conductive layers, containing chlorine introduced therein. Thus, the silicon oxide film is inhibited from formation of electron traps while a large number of holes are formed in an initial stage of electron injection into the silicon oxide film.

18 Claims, 14 Drawing Sheets

SEMICONDUCTOR DEVICE HAVING SILICON OXIDE FILM

BACKGROUND OF THE INVENTION

1. Field of the Invention

The present invention relates to a semiconductor device, and more particularly, it relates to a semiconductor device including an $SiO_2$ film (silicon oxide film) applied to a gate insulator film or a tunnel insulator film.

2. Description of the Background Art

A liquid crystal display or the like has recently been watched with interest as a lightweight display allowing miniaturization. This display, requiring a high voltage of about 15 V for driving, generally employs a control LSI (large scale integrated circuit) consisting of a reliable field-effect transistor (voltage-resistant transistor) unbreakable with a load of a high voltage and a fine transistor (low-voltage transistor) for implementing low power consumption and a high-speed operation.

In order to improve electric strength of the voltage-resistant transistor for attaining high reliability, it is generally effective to improve insulation properties of a gate insulator film held between a gate electrode constituting the voltage-resistant transistor and a silicon substrate. The insulation properties of the gate insulator film are generally improved by increasing the thickness of the gate insulator film consisting of $SiO_2$.

An STI (shallow trench isolation) technique of forming a shallow trench on the surface of a substrate by dry etching and thereafter embedding an insulator in the trench thereby isolating elements from each other has recently been widely employed. When STI is employed for element isolation of a voltage-resistant transistor and a gate insulator film of the voltage-resistant transistor consisting of a thick $SiO_2$ film is formed by thermal oxidation, however, the thickness of the gate insulator film is reduced on an upper corner of a trench formed by STI, disadvantageously leading to reduction of voltage resistance of the transistor. Therefore, it is effective to form the gate insulator film of the voltage-resistant transistor by CVD (chemical vapor deposition) capable of covering the overall surface including the upper corner of the trench formed by STI with a uniform thickness.

However, a gate insulator film formed by CVD or a thin gate insulator film formed by thermal oxidation is generally inferior in quality. In an initial stage of formation of the gate insulator film, an incomplete $SiO_2$ film is easily formed due to a natural oxide film or a structural transition layer. This incomplete $SiO_2$ film contains dangling bonds not completely in the form of O—Si—O. In the gate insulator film formed by CVD or the thin gate insulator film formed by thermal oxidation, therefore, a large number of electron traps are disadvantageously formed when electrons are continuously injected into the gate insulator film. Consequently, the number of electrons captured by the electron traps is increased with the time for electron injection, and hence the threshold voltage of the voltage-resistant transistor is disadvantageously remarkably changed. Thus, the time for reaching the maximum value of allowable threshold voltage variations is reduced in view of the characteristics of the voltage-resistant transistor, to disadvantageously reduce operational reliability (working life).

On the other hand, a nonvolatile memory such as an EPROM (erasable and programmable read only memory) or an EEPROM (electrically erasable and programmable read only memory) has recently been watched with interest as a semiconductor memory capable of replacing a hard disk or a floppy disk which is a magnetic memory.

The EPROM or the EEPROM stores data in response to presence/absence of electrons stored in a floating gate electrode forming a memory cell. Further, the EPROM or the EEPROM reads data by detecting change of a threshold voltage responsive to presence/absence of electrons stored in the floating gate electrode. In relation to the EEPROM, known is a flash EEPROM entirely erasing data in a memory cell array or dividing a memory cell array into arbitrary blocks and collectively erasing data in units of the blocks. The flash EEPROM, referred to as a flash memory, has excellent characteristics such as a large capacity, low power consumption, a high speed and shock resistance. Therefore, the flash memory is applied to various portable instruments. Further, each memory cell is constituted by a single transistor, whereby the flash memory can be easily highly integrated.

In general, a stacked gate memory cell structure is known as the structure of memory cells forming a flash memory. In each memory cell of such a stacked gate flash memory, a source region and a drain region are provided on the surface of a semiconductor substrate to hold a channel region therebetween at a prescribed interval. A floating gate electrode is provided on the channel region through a tunnel insulator film. A control gate electrode is formed on the floating gate electrode through a gate insulator film.

In order to write data in the stacked gate flash memory, a voltage of 10-odd V is applied to the control gate electrode while applying a voltage to the drain region for converting electrons flowing in the channel region of the semiconductor substrate to hot electrons. Thus, the hot electrons are injected into the floating gate electrode, thereby writing data. In order to erase data, a voltage of 10-odd V is applied to the source region. Thus, a Fowler-Nordheim tunnel current (F-N tunnel current) is fed from the source region toward the floating gate electrode, thereby extracting electrons stored in the floating gate electrode through the tunnel insulator film. In order to read data, the flash memory detects a current (cell current), flowing between the source region and the drain region, varying with presence/absence of electrons stored in the floating gate electrode, thereby determining the data.

Thus, the memory cell of the conventional stacked gate flash memory injects hot electrons into the floating gate electrode in writing, and utilizes an F-N tunnel current for extracting the electrons stored in the floating gate electrode in erasing.

In general, a thin $SiO_2$ film formed by thermal oxidation is employed as the tunnel insulator film of the flash memory. However, the thin $SiO_2$ film disadvantageously contains a large quantity of incomplete $SiO_2$, as hereinabove described. When the flash memory applies a voltage to the source region for erasing data, therefore, electrons accelerated in a high electric field pass through the tunnel insulator film containing incomplete $SiO_2$, to apply remarkable stress to the tunnel insulator film. Consequently, a large number of electron traps are disadvantageously formed in the tunnel insulator film. The electron traps formed in the tunnel insulator film inhibit transfer of electrons from the floating gate electrode to the source region in data erasing, leading to insufficient extraction of the electrons from the floating gate electrode. Following increase of the numbers of data writing and erasing, the number of electron traps is also increased due to the incomplete $SiO_2$, to result in further reduction of the quantity of electrons extracted from the floating gate electrode. Thus, the number of electrons stored in the floating gate electrode after erasing is so increased that the cell current is disadvantageously reduced in data reading in an erased state. In this case, difference between the values of the cell current in writing and erasing is reduced as the numbers of data writing and erasing are increased, leading to difficulty in determination of data. In general, therefore, it is difficult to increase the number of data rewriting, and it is consequently difficult to improve the working life of the flash memory.

SUMMARY OF THE INVENTION

An object of the present invention is to provide a semiconductor device whose working life can be improved.

Another object of the present invention is to inhibit an $SiO_2$ film (silicon oxide film) from formation of electron traps in the aforementioned semiconductor device.

In order to attain the aforementioned objects, a semiconductor device according to an aspect of the present invention comprises a first conductive layer, a second conductive layer and a silicon oxide film, formed between the first conductive layer and the second conductive layer, containing chlorine introduced therein.

In the semiconductor device according to this aspect, the silicon oxide film containing chlorine introduced therein is provided between the first conductive layer and the second conductive layer, as hereinabove described. Therefore, when the silicon oxide film containing chlorine introduced therein is applied to a gate insulator film of a voltage-resistant field-effect transistor provided with the gate insulator film between a semiconductor substrate (first conductive layer) and a gate electrode (second conductive layer), for example, chlorine is conceivably coupled with dangling bonds (uncoupled bonds) of Si in the silicon oxide film constituting the gate insulator film, whereby formation of electron traps can conceivably be suppressed in an initial stage of electron injection into the silicon oxide film constituting the gate insulator film. In the gate insulator film consisting of the silicon oxide film containing chlorine introduced therein, further, a large number of holes are conceivably formed in the vicinity of the interface between the semiconductor substrate and the gate insulator film in the initial stage of electron injection into the gate insulator film. In the initial stage of electron injection into the gate insulator film, the gate potential (threshold voltage) fluctuates in a positive sense due to the aforementioned suppression of formation of electron traps and formation of a large number of holes. Thereafter the number of electron traps is increased following increase of the electron injection time while the number of electrons captured by the electron traps is also increased, whereby the gate potential (threshold voltage) gradually fluctuates in a negative sense. Thus, according to this aspect, the threshold voltage fluctuates in the positive sense in the initial stage and thereafter fluctuates in the negative sense, whereby the variation of the threshold voltage from the initial level can be reduced after a lapse of a prescribed time. Consequently, the time for reaching the maximum threshold voltage variation allowable in view of the characteristics of the field-effect transistor can be so increased that operational reliability (working life) can be improved.

When the silicon oxide film containing chlorine introduced therein is applied to a tunnel insulator film of a nonvolatile memory provided with the tunnel insulator film between a semiconductor substrate (first conductive layer) and a floating gate (second conductive layer), for example, chlorine is conceivably coupled with dangling bonds (uncoupled bonds) of Si in the silicon oxide film constituting the tunnel insulator film, whereby formation of electron traps can conceivably be suppressed in an initial stage of electron injection into the silicon oxide film constituting the tunnel insulator film. In the tunnel insulator film consisting of the silicon oxide film containing chlorine introduced therein, further, a large number of holes are conceivably formed in the vicinity of the interface between the semiconductor substrate and the tunnel insulator film in the initial stage of electron injection into the tunnel insulator film. In the initial stage of electron injection into the tunnel insulator film, a floating gate potential fluctuates in a positive sense due to the aforementioned suppression of formation of electron traps and formation of a large number of holes. Thereafter the number of electron traps is increased following increase of the electron injection time while the number of electrons captured by the electron traps is also increased, whereby the floating gate potential gradually fluctuates in a negative sense. Thus, according to this aspect, the floating gate potential fluctuates in the positive sense in the initial stage and thereafter fluctuates in the negative sense, whereby the variation of the floating gate potential from the initial level can be reduced after a lapse of a prescribed time. In other words, electrons can be further easily extracted from a floating gate to a source/drain region as compared with the prior art in data erasing after the lapse of the prescribed time, whereby the number of electrons remaining in the floating gate can be reduced when erasing data (extracting electrons) after the lapse of the prescribed time. Thus, it is possible to relax such an inconvenience that a cell current is reduced in an erased state in data reading following increase of the number of electrons remaining in the floating gate after data erasing. Therefore, it is possible to relax such an inconvenience that data is hard to determine due to reduction of the cell current in the erased state in reading after the lapse of the prescribed time, whereby the number of data rewriting can be increased. Consequently, the working life can be improved.

In the semiconductor device according to the aforementioned aspect, the chlorine concentration in the silicon oxide film is preferably at least $1\times10^{19}$ atoms/cm$^3$. According to this structure, the silicon oxide film can be inhibited from formation of electron traps while a large number of holes can be formed in the initial stage of electron injection into the silicon oxide film.

In the semiconductor device according to the aforementioned aspect, the maximum chlorine concentration in the silicon oxide film is preferably not more than $1\times10^{21}$ atoms/cm$^3$. According to this structure, the silicon oxide film can be inhibited from formation of electron traps while a large number of holes can be formed in the initial stage of electron injection into the silicon oxide film. Further, the silicon oxide film can be inhibited from reduction of the film quality caused by introduction of excess chlorine.

In the semiconductor device according to the aforementioned aspect, nitrogen is preferably introduced into the silicon oxide film in concentration of at least $1\times10^{20}$ atoms/cm$^3$ in addition to chlorine. According to this structure, nitrogen is so easily coupled with dangling bonds of Si in the silicon oxide film that formation of electron traps can be further suppressed in the initial stage of electron injection into the silicon oxide film.

In the aforementioned semiconductor device having the silicon oxide film containing chlorine and nitrogen introduced therein, the maximum value of the concentration profile of chlorine introduced into the silicon oxide film may be smaller than the concentration profile of nitrogen introduced into the silicon oxide film.

In the aforementioned semiconductor device having the silicon oxide film containing chlorine and nitrogen introduced therein, a position maximizing the concentration profile of nitrogen introduced into the silicon oxide film is preferably located closer to the interface between the silicon oxide film and the first conductive layer than a position maximizing the concentration profile of chlorine introduced into the silicon oxide film. According to this structure, SiN bonds hardly uncoupled due to strong bond energy with Si can be formed in the vicinity of the interface between the silicon oxide film and the first conductive layer. Thus, formation of electron traps can be further suppressed in the initial stage of electron injection into the silicon oxide film.

In this case, SiN is preferably formed in the vicinity of the interface between the silicon oxide film and the first conductive layer.

In this case, further, the position maximizing the concentration profile of chlorine introduced into the silicon oxide film is preferably located closer to the interface between the silicon oxide film and the first conductive layer than the central portion of the silicon oxide film along the thickness direction. According to this structure, the silicon oxide film can be inhibited from formation of electron traps in the initial stage of electron injection and a large number of holes can be formed on the interface between the silicon oxide film and the first conductive layer.

In the aforementioned semiconductor device having the silicon oxide film containing chlorine and nitrogen introduced therein, a position maximizing the concentration profile of nitrogen introduced into the silicon oxide film is preferably located closer to the interface between the silicon oxide film and the second conductive layer than a position maximizing the concentration profile of chlorine introduced into the silicon oxide film. According to this structure, SiN bonds hardly uncoupled due to strong bond energy with Si can be formed in the vicinity of the interface between the silicon oxide film and the second conductive layer. Thus, formation of electron traps can be further suppressed in the initial stage of electron injection into the silicon oxide film.

In this case, SiN is preferably formed in the vicinity of the interface between the silicon oxide film and the second conductive layer.

In this case, further, the position maximizing the concentration profile of chlorine introduced into the silicon oxide film is located closer to the interface between the silicon oxide film and the second conductive layer than the central portion of the silicon oxide film along the thickness direction. According to this structure, the silicon oxide film can be inhibited from formation of electron traps in the initial stage of electron injection and a large number of holes can be formed on the interface between the silicon oxide film and the second conductive layer.

In the semiconductor device according to the aforementioned aspect, the silicon oxide film containing chlorine introduced therein preferably includes a tunnel insulator film of a nonvolatile memory. According to this structure, chlorine is conceivably coupled with dangling bonds (uncoupled bonds) of Si in the silicon oxide film, containing chlorine introduced therein, constituting the tunnel insulator film, whereby formation of electron traps can conceivably be suppressed in an initial stage of electron injection into the silicon oxide film constituting the tunnel insulator film. In the tunnel insulator film consisting of the silicon oxide film containing chlorine introduced therein, further, a large number of holes are conceivably formed in the vicinity of the interface between the semiconductor substrate and the tunnel insulator film in the initial stage of electron injection into the tunnel insulator film. In the initial stage of electron injection into the tunnel insulator film, a floating gate potential fluctuates in a positive sense due to the aforementioned suppression of formation of electron traps and formation of a large number of holes. Thereafter the number of electron traps is increased following increase of the electron injection time while the number of electrons captured by the electron traps is also increased, whereby the floating gate potential gradually fluctuates in a negative sense. Thus, the floating gate potential fluctuates in the positive sense in the initial stage and thereafter fluctuates in the negative sense, whereby the variation of the floating gate potential can be reduced after a lapse of a prescribed time. In other words, electrons can be further easily extracted from a floating gate to a source/drain region as compared with the prior art in data erasing after the lapse of the prescribed time, whereby the number of electrons remaining in the floating gate can be reduced when erasing data (extracting electrons) after the lapse of the prescribed time. Thus, it is possible to relax such an inconvenience that a cell current is reduced in an erased state in data reading following increase of the number of electrons remaining in the floating gate after data erasing. Therefore, it is possible to relax such an inconvenience that data is hard to determine due to reduction of the cell current in the erased state in reading after the lapse of the prescribed time, whereby the number of data rewriting can be increased. Consequently, the working life can be improved.

In the aforementioned structure including the nonvolatile memory having the tunnel insulator film consisting of the silicon oxide film containing chlorine introduced therein, the potential of a floating gate preferably fluctuates in a positive sense in an initial stage of electron injection into the tunnel insulator film, and the potential of the floating gate thereafter preferably gradually fluctuates in a negative sense following increase of the time of electron injection into the tunnel insulator film. According to this structure, the variation of the floating gate potential can be easily reduced after the lapse of the prescribed time.

In the aforementioned structure including the nonvolatile memory having the tunnel insulator film consisting of the silicon oxide film containing chlorine introduced therein, the nonvolatile memory preferably includes a floating gate electrode formed on a semiconductor substrate and a control gate electrode formed on the floating gate electrode, and the tunnel insulator film including the silicon oxide film containing chlorine introduced therein is preferably arranged between the semiconductor substrate and the floating gate electrode. According to this structure, the number of data rewriting can be easily increased in a stacked gate nonvolatile memory.

In the aforementioned structure including the nonvolatile memory having the tunnel insulator film consisting of the silicon oxide film containing chlorine introduced therein, the nonvolatile memory preferably includes a floating gate electrode formed on a semiconductor substrate and a control gate electrode formed to extend over the semiconductor substrate and the floating gate electrode, and the tunnel insulator film including the silicon oxide film containing chlorine introduced therein is preferably arranged between the floating gate electrode and the control gate electrode. According to this structure, the number of data rewriting can be easily increased in a split gate nonvolatile memory.

In this case, the chlorine concentration in the silicon oxide film is preferably at least $1 \times 10^{19}$ atoms/cm$^3$. According to this structure, the silicon oxide film can be inhibited from formation of electron traps while a large number of holes can be formed in the initial stage of electron injection into the silicon oxide film.

In this case, the maximum chlorine concentration in the silicon oxide film is preferably not more than $1 \times 10^{21}$ atoms/$cm^3$. According to this structure, the silicon oxide film can be inhibited from formation of electron traps while a large number of holes can be formed in the initial stage of electron injection into the silicon oxide film. Further, the silicon oxide film can be inhibited from reduction of the film quality caused by introduction of excess chlorine.

In this case, nitrogen is preferably introduced into the silicon oxide film in concentration of at least $1 \times 10^{20}$ atoms/$cm^3$ in addition to chlorine. According to this structure, nitrogen is so easily coupled with dangling bonds of Si in the silicon oxide film that formation of electron traps can be further suppressed in the initial stage of electron injection into the silicon oxide film.

In the semiconductor device according to the aforementioned aspect, the first conductive layer is preferably a channel region of a field-effect transistor, the second conductive layer is preferably a gate electrode of a field-effect transistor, and the silicon oxide film is preferably a gate insulator film of a field-effect transistor. According to this structure, chlorine is conceivably coupled with dangling bonds (uncoupled bonds) of Si in the silicon oxide film constituting the gate insulator film, whereby formation of electron traps can conceivably be suppressed in an initial stage of electron injection into the silicon oxide film, containing chlorine introduced therein, constituting the gate insulator film. In the gate insulator film consisting of the silicon oxide film containing chlorine introduced therein, further, a large number of holes are conceivably formed in the vicinity of the interface between the semiconductor substrate and the gate insulator film in the initial stage of electron injection into the gate insulator film. In the initial stage of electron injection into the gate insulator film, the gate potential (threshold voltage) fluctuates in a positive sense due to the aforementioned suppression of formation of electron traps and formation of a large number of holes. Thereafter the number of electron traps is increased following increase of the electron injection time while the number of electrons captured by the electron traps is also increased, whereby the gate potential (threshold voltage) gradually fluctuates in a negative sense. Thus, the threshold voltage fluctuates in the positive sense in the initial stage and thereafter fluctuates in the negative sense, whereby the variation of the threshold voltage from the initial level can be reduced after a lapse of a prescribed time. Consequently, the time for reaching the maximum value of the threshold voltage variation allowable in view of the characteristics of the field-effect transistor can be so increased that operational reliability (working life) can be improved.

In this case, a threshold voltage preferably fluctuates in a positive sense in an initial stage of electron injection into the gate insulator film, and the threshold voltage thereafter preferably gradually fluctuates in a negative sense following increase of the time of electron injection into the gate insulator film. According to this structure, the variation of the threshold voltage can be easily reduced after a lapse of a prescribed time.

The foregoing and other objects, features, aspects and advantages of the present invention will become more apparent from the-following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
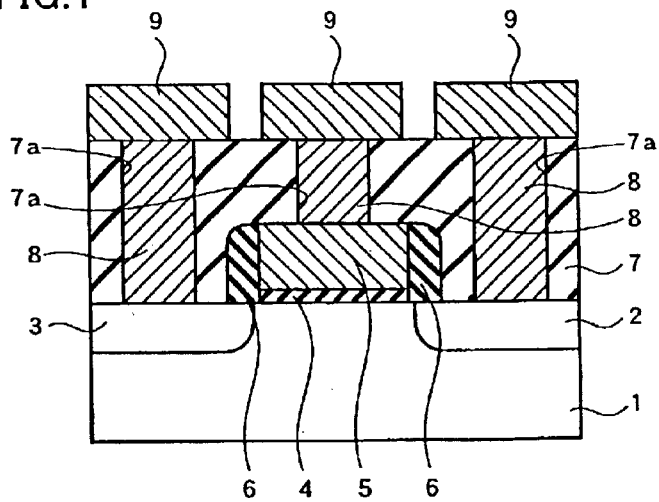
FIG. 1 is a sectional view showing a voltage-resistant transistor (semiconductor device) according to a first embodiment of the present invention.

First, the structure of a voltage-resistant transistor according to a first embodiment of the present invention is described with reference to FIG. 1. According to the first embodiment, n-type source and drain regions 2 and 3 are formed on the surface of a p-type silicon substrate 1 at a prescribed interval, as shown in FIG. 1. A gate insulator film 4 consisting of an $SiO_2$ film (silicon oxide film) having a large thickness of about 15 nm and containing chlorine and nitrogen is formed on a channel region between the source and drain regions 2 and 3. A gate electrode 5 consisting of polysilicon having a thickness of about 150 nm and containing phosphorus (P) introduced therein as an impurity is formed on the upper surface of the gate insulator film 4. Side wall insulator films 6 of $SiO_2$ are formed on the side surfaces of the gate insulator film 4 and the gate electrode 5 and part of the upper surface of the p-type silicon substrate 1. The p-type silicon substrate 1 is an example of the "first conductive layer" in the present invention, and the gate electrode 5 is an example of the "second conductive layer" in the present invention. The gate insulator film 4 is an example of the "silicon oxide film" in the present invention.

An interlayer dielectric film 7 having contact holes 7a is formed to cover the overall upper surfaces of the p-type silicon substrate 1, the gate electrode 5 and the side wall insulator films 6. Plug electrodes 8 are formed in the contact holes 7a to be connected to the source region 2, the drain region 3 and the gate electrode 5 respectively. Metal wires 9 are formed on the interlayer dielectric film 7 to be connected to the plug electrodes 8.

Figure 2:
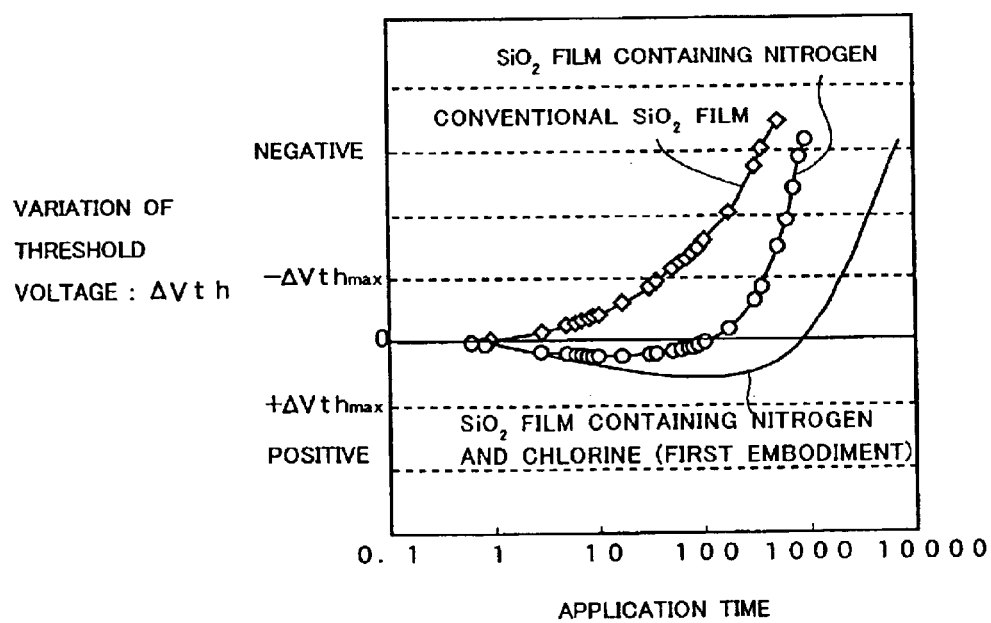
FIG. 2 is a characteristic diagram showing an effect of the voltage-resistant transistor according to the first embodiment shown in FIG. 1.

FIG. 2 is a characteristic diagram showing relations between voltage application times and threshold voltages in a voltage-resistant transistor having a gate insulator film consisting of a conventional $SiO_2$ film containing no nitrogen and chlorine, a voltage-resistant transistor having a gate insulator film consisting of an $SiO_2$ film containing nitrogen introduced therein and the voltage-resistant transistor according to the first embodiment having the gate insulator film 4 consisting of the $SiO_2$ film containing nitrogen and chlorine introduced therein. An effect of the voltage-resistant transistor according to the first embodiment having the gate insulator film 4 consisting of the $SiO_2$ film containing nitrogen and chlorine introduced therein is now described with reference to FIG. 2. Referring to FIG. 2, electrons were continuously injected into the voltage-resistant transistor having the gate insulator film formed by the conventional $SiO_2$ film containing no nitrogen and chlorine, the voltage-resistant transistor having the gate insulator film formed by the $SiO_2$ film containing nitrogen introduced therein by about $5 \times 10^{20}$ atoms/cm$^3$ at the maximum and the voltage-resistant transistor according to the first embodiment having the gate insulator film 4 consisting of the $SiO_2$ film containing chlorine introduced therein by about $2 \times 10^{20}$ atoms/cm$^3$ at the maximum and nitrogen introduced therein by about $5 \times 10^{20}$ atoms/cm$^3$ at the maximum respectively. In this case, the threshold voltages of these voltage-resistant transistors fluctuated as shown in FIG. 2. Referring to FIG. 2, symbol $\pm \Delta V th_{max}$ denotes the maximum values of threshold voltage variations allowable in view of the characteristics of the voltage-resistant transistors.

It is understood that the voltage-resistant transistor according to the first embodiment having the gate insulator film 4 consisting of the $SiO_2$ film containing nitrogen and chlorine introduced therein exhibits the longest time for bringing the threshold voltage to the maximum value $-\Delta V th_{max}$ in a negative sense, as shown in FIG. 2. This is because the voltage-resistant transistor according to the first embodiment exhibits the so-called turnaround effect, in which the threshold voltage fluctuates in a positive sense in an initial stage of electron injection into the gate insulator film 4 and thereafter gradually fluctuates in the negative sense following increase of the electron injection time. While the voltage-resistant transistor having the gate insulator film consisting of the $SiO_2$ film containing only nitrogen introduced therein also exhibits this turnaround effect, a variation $\Delta V th$ of the threshold voltage Vth moving in the positive sense is small as compared with the voltage-resistant transistor according to the first embodiment having the gate insulator film 4 consisting of the $SiO_2$ film containing nitrogen and chlorine introduced therein.

According to the first embodiment, as hereinabove described, chlorine and nitrogen are so introduced into the gate insulator film 4 that the threshold voltage fluctuates in the positive sense in the initial stage of electron injection into the gate insulator film 4 and thereafter gradually fluctuates in the negative sense following increase of the electron injection time due to the turnaround effect, whereby a variation $\Delta V th$ of the threshold voltage Vth from the initial value can be reduced after a lapse of a prescribed time. Thus, the time for bringing the threshold voltage to the maximum value $-\Delta V th_{max}$ of allowable variations of the threshold voltage in the negative sense can be increased in view of the characteristics of the voltage-resistant transistor. Consequently, operational reliability (working life) can be improved.

The voltage-resistant transistor according to the first embodiment exhibits the turnaround effect conceivably for the following reason: In the voltage-resistant transistor according to the first embodiment, chlorine is introduced into the $SiO_2$ film constituting the gate insulator film 4, whereby the dangling bonds of Si in the $SiO_2$ film are so easily coupled with chlorine that the $SiO_2$ film constituting the gate insulator film 4 can conceivably be inhibited from formation of electron traps in an initial stage of electron injection into the $SiO_2$ film. In the gate insulator film 4 consisting of the $SiO_2$ film containing chlorine, further, a large number of holes are conceivably formed in the vicinity of the interface between the p-type silicon substrate 1 and the gate insulator film 4 in the initial stage of electron injection into the gate insulator film 4. In the initial stage of electron injection into the gate insulator film 4, the threshold voltage fluctuates in the positive sense as shown in FIG. 2 due to the aforementioned suppression of formation of electron traps and formation of a large number of holes. Thereafter the number of electron traps is increased following increase of the electron injection time while the number of electrons captured by the electron traps is also increased, whereby the threshold voltage gradually fluctuates in the negative sense. The turnaround effect is conceivably caused in the aforementioned manner.

According to the first embodiment, as hereinabove described, nitrogen is introduced into the $SiO_2$ film constituting the gate insulator film 4 in addition to chlorine, whereby nitrogen is so easily coupled with the dangling bonds of Si in the gate insulator film 4 that formation of electron traps can be further suppressed in the initial stage of electron injection into the gate insulator film 4.

Figure 3:
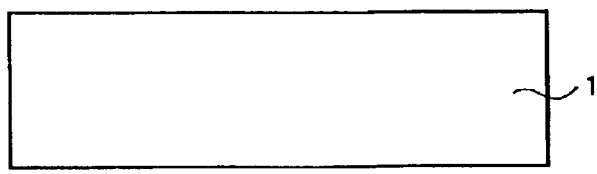
FIGS. 3 to 11 are sectional views for illustrating a fabrication process for the voltage-resistant transistor according to the first embodiment shown in FIG. 1.
Figure 4:
Figure 12:
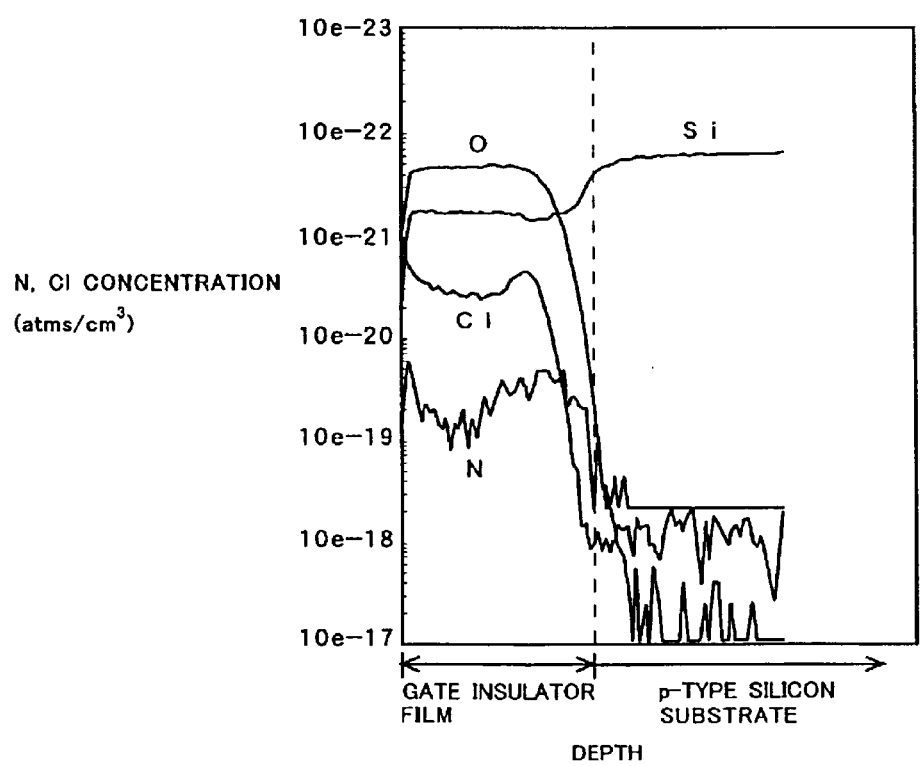
FIG. 12 is a characteristic diagram showing concentration profiles of Si, O, Cl and N immediately after deposition of a gate insulator film of the voltage-resistant transistor according to the first embodiment.
Figure 13:
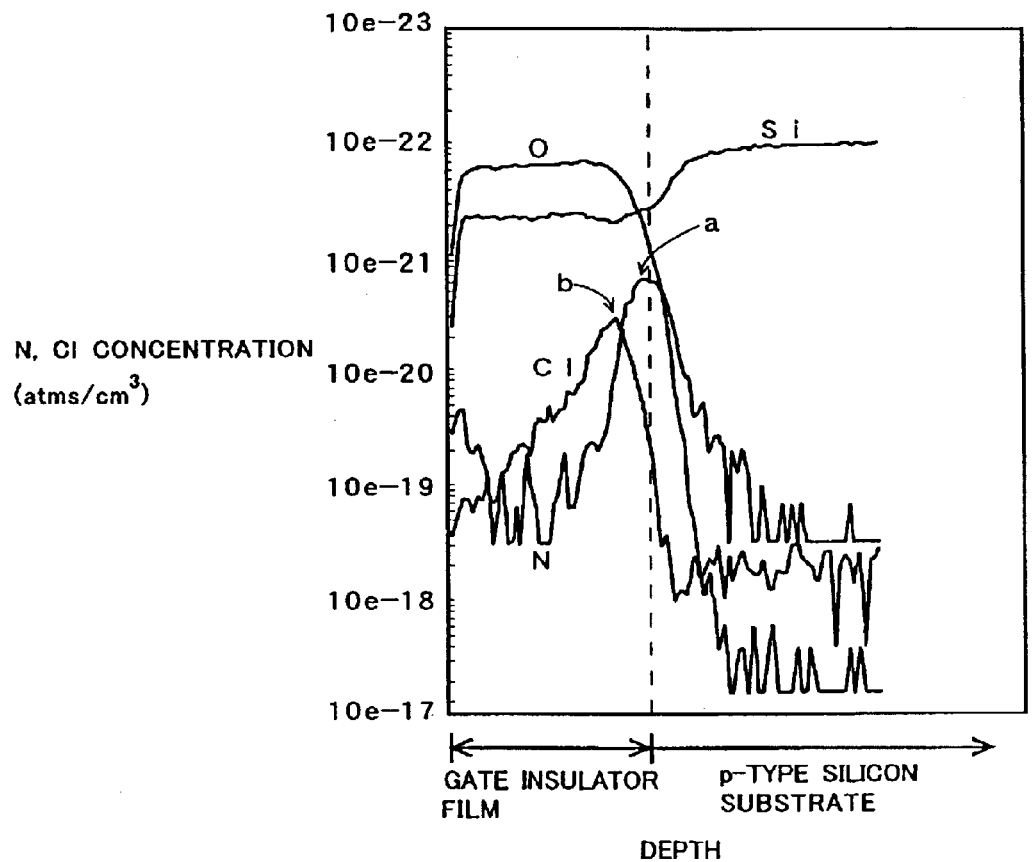
FIG. 13 is a characteristic diagram showing concentration profiles of Si, O, Cl and N after heat treatment performed on the gate insulator film of the voltage-resistant transistor according to the first embodiment.

FIGS. 3 and 5 to 11 show a fabrication process for the voltage-resistant transistor according to the first embodiment on the section identical to that shown in FIG. 1, and FIG. 4 shows the fabrication process on a section along a plane rotated by 90° from that shown in FIG. 3. FIG. 12 is a characteristic diagram showing concentration profiles of Si, O, Cl and N immediately after deposition of the gate insulator film 4 of the voltage-resistant transistor according to the first embodiment. FIG. 13 is a characteristic diagram showing concentration profiles of Si, O, Cl and N after heat treatment performed on the gate insulator film 4 of the voltage-resistant transistor according to the first embodiment. The fabrication process for the voltage-resistant transistor according to the first embodiment is now described with reference to FIGS. 1 and 3 to 13.

As shown in FIGS. 3 and 4, insulator films 10 are formed on prescribed regions of the surface of the p-type silicon substrate 1, thereby isolating elements.

Figure 5:
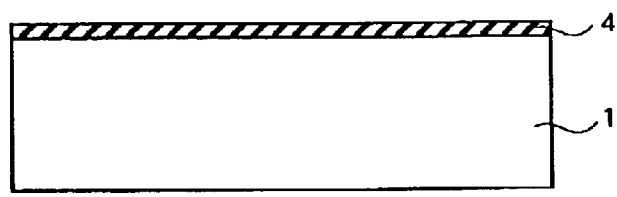

As shown in FIG. 5, the gate insulator film 4 consisting of the $SiO_2$ film containing chlorine and nitrogen introduced therein is formed on the p-type silicon substrate 1 with a thickness of about 15 nm by low-pressure CVD. More specifically, the gate insulator film 4 is deposited under conditions of a pressure of $133 \times 10$ Pa and a substrate temperature of about 800° C. with material gas of 10 sccm to 20 sccm of dichlorosilane gas and 0.5 SLM (standard liter per minute) to 1.0 SLM of N₂O gas at a rate of about 1 nm/min. Thus, the gate insulator film 4 consisting of the $SiO_2$ film is formed with the concentration profiles shown in FIG. 12. Thereafter heat treatment is performed in an oxynitriding gas atmosphere of about 1000° C. for about 30 seconds by RTA (rapid thermal annealing), thereby densifying the gate insulator film 4 consisting of the $SiO_2$ film and further introducing nitrogen. According to the heat treatment performed in the oxynitriding gas atmosphere, the concentration profiles of the $SiO_2$ film constituting the gate insulator film 4 change to those shown in FIG. 13.

According to the first embodiment, the maximum chlorine concentration and the maximum nitrogen concentration in the $SiO_2$ film constituting the gate insulator film 4 are about $2 \times 10^{21}$ atoms/cm³ and about $5 \times 10^{20}$ atoms/cm³ respectively, as shown in FIG. 13. In the $SiO_2$ film constituting the gate insulator film 4, a peak position a maximizing the concentration profile of nitrogen is located closer to the interface between the gate insulator film 4 and the p-type silicon substrate 1 than a peak position b maximizing the concentration profile of chlorine.

According to the first embodiment, as hereinabove described, the gate insulator film 4 is so formed that the peak position a maximizing the concentration profile of nitrogen is located closer to the interface between the gate insulator film 4 and the p-type silicon substrate 1 than the peak position b maximizing the concentration profile of chlorine, whereby SiN bonds hardly uncoupled due to strong bond energy with Si can be formed in the vicinity of the interface and formation of electron traps can be further suppressed in the initial stage of electron injection into the gate insulator film 4.

Figure 6:
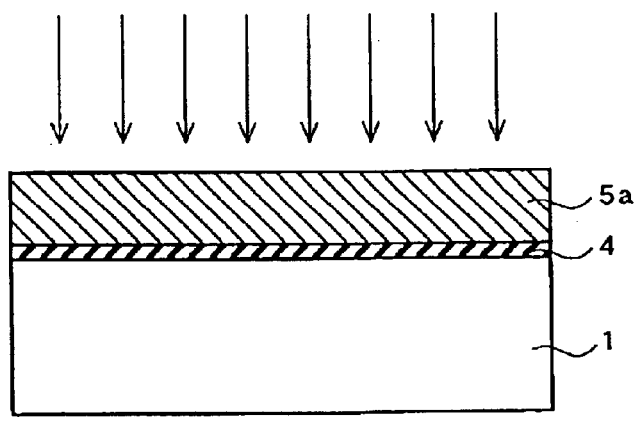

As shown in FIG. 6, a polysilicon film 5a is deposited on the gate insulator film 4 consisting of the $SiO_2$ film with a thickness of about 150 nm. Phosphorus is ion-implanted from above the upper surface of the polysilicon film 5a, thereby providing the polysilicon film 5a with conductivity.

Figure 7:
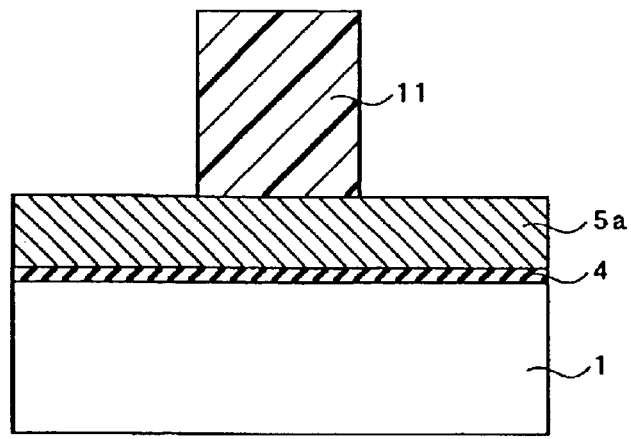
Figure 8:
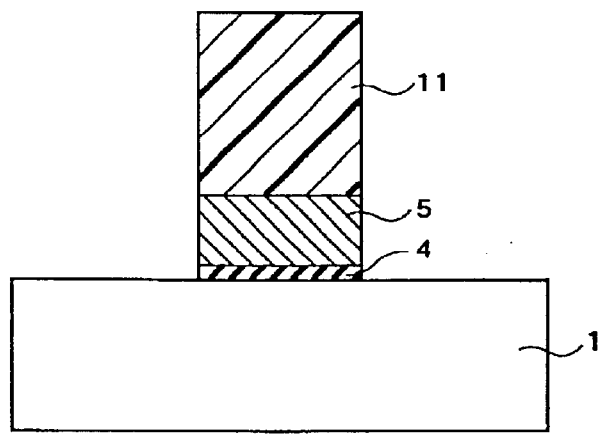

As shown in FIG. 7, a resist film 11 is formed on a prescribed region of the polysilicon film 5a by photolithography. The resist film 11 is employed as a mask for selectively etching and patterning the polysilicon film 5a and the gate insulator film 4. Thus, the gate insulator film 4 and the gate electrode 5 are formed as shown in FIG. 8. The resist film 11 is thereafter removed.

Figure 9:
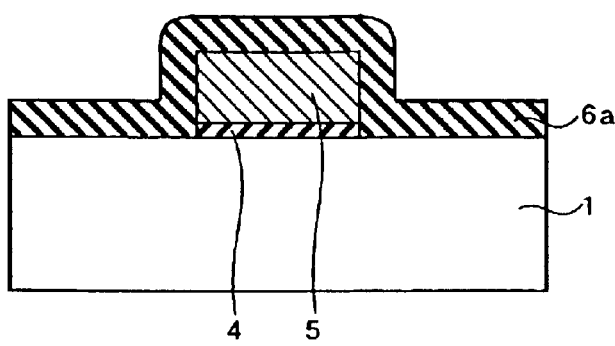
Figure 10:
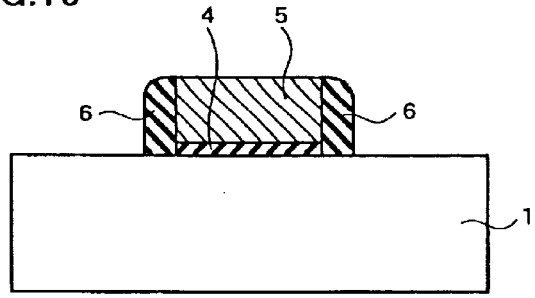

As shown in FIG. 9, an insulator film 6a consisting of $SiO_2$ is deposited to cover the overall upper surfaces of the p-type silicon substrate 1 and the gate electrode 5. Thereafter the overall surface of the insulator film 6a is etched back by RIE (reactive ion etching), thereby forming the side wall insulator films 6 as shown in FIG. 10.

Figure 11:
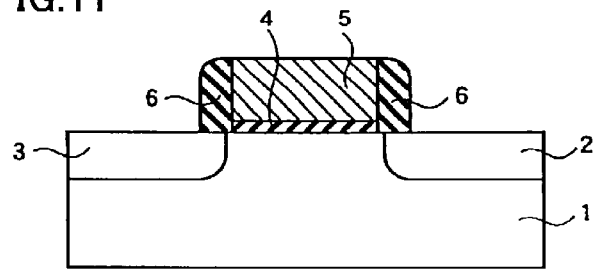

As shown in FIG. 11, the side wall insulator films 6 are employed as masks for ion-implanting As (arsenic) into the p-type silicon substrate 1 under conditions of implantation energy of 65 keV and dosage of $5.0 \times 10^{15}$ cm⁻², thereby forming the n-type source and drain regions 2 and 3.

Finally, the interlayer dielectric film 7 is formed to cover the overall upper surfaces of the p-type silicon substrate 1, the gate electrode 5 and the side wall insulator films 6 followed by formation of the contact holes 7a in the interlayer dielectric film 7 as shown in FIG. 1, similarly to a process of fabricating a conventional MOS-LSI (metal oxide silicon large scale integrated circuit). Then, the plug electrodes 8 are formed in the contact holes 7a to be electrically connected with the source region 2, the drain region 3 and the gate electrode 5 respectively. The metal wires 9 are formed to be connected with the plug electrodes 8. Thus, the voltage-resistant transistor constituting an LSI is completed according to the first embodiment.

(Second Embodiment)

Figure 14:
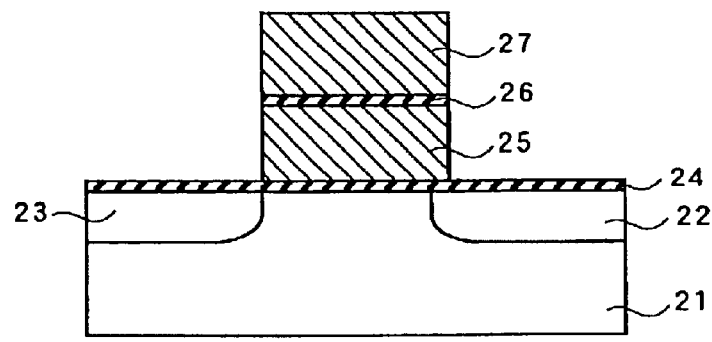
FIG. 14 is a sectional view showing a memory cell constituting a stacked gate flash memory (semiconductor device) according to a second embodiment of the present invention.

Referring to FIG. 14, a stacked gate flash memory according to a second embodiment of the present invention is described with reference to an $SiO_2$ film, constituting a tunnel insulator film, containing chlorine and nitrogen introduced therein.

The structure of each memory cell forming the stacked gate flash memory according to the second embodiment is described with reference to FIG. 14. According to the second embodiment, n-type source and drain regions 22 and 23 are formed on the surface of a p-type silicon substrate 21 at a prescribed interval, as shown in FIG. 14.

According to the second embodiment, a tunnel insulator film 24 consisting of an $SiO_2$ film (silicon oxide film) having a thickness of about 8 nm to about 10 nm and containing chlorine and nitrogen introduced therein is formed on the upper surface of the p-type silicon substrate 21. A floating gate electrode 25 of polysilicon doped with phosphorus having a thickness of about 100 nm is formed on a portion of the tunnel insulator film 24 located between the source and drain regions 22 and 23. This floating gate electrode 25 is formed to overlap with the source region 22. A control gate electrode 27 of polysilicon doped with phosphorus is formed on the floating gate electrode 25 through a gate insulator film 26 of $SiO_2$ having a thickness of about 15 nm. The p-type silicon substrate 21 is an example of the "first conductive layer" in the present invention, and the floating gate electrode 25 is an example of the "second conductive layer" in the present invention. The tunnel insulator film 24 is an example of the "silicon oxide film" in the present invention.

An operation of the memory cell according to the second embodiment is now described. Table 1 shows voltages applied to the source region 22, the drain region 23 and the control gate electrode 27 of the memory cell respectively in operation.

TABLE 1

|  | Control Gate Electrode | Drain Region | Source Region |
| --- | --- | --- | --- |
| Reading | 5 V | 0.5 V~1.0 V | GND |
| Writing | 10 V~15 V | 4 V | GND |
| Erasing | GND | OPEN | 10 V~15 V |

Referring to Table 1, the voltage of 10 V to 15 V is applied to the control gate electrode 27, the source region 22 is set to a ground voltage GND and the voltage of 4 V is applied to the drain region 23 in order to write data in the memory cell of the stacked gate flash memory. Thus, channel hot electrons formed in the vicinity of the drain region 23 are injected into the floating gate electrode 25, thereby writing the data. In order to erase data, the voltage of 10 V to 15 V is applied to the source region 22, the control gate electrode 25 is set to the ground voltage GND and the drain region 23 is brought into an open state as shown in Table 1. Thus, an F-N tunnel current flows from the source region 22 toward the floating gate electrode 25. In other words, electrons stored in the floating gate electrode 25 are extracted to the source region 22 through the tunnel insulator film 24, thereby erasing the data. In order to read data, the voltage of 5 V is applied to the control gate electrode 27, the source region 22 is set to the ground voltage GND and the voltage of 0.5 V to 1.0 V is applied to the drain region 23, as shown in Table 1. A cell current flowing between the source region 22 and the drain region 23 varies with presence/absence of electrons stored in the floating gate electrode 25. Therefore, the flash memory determines whether or not the data is "1" or "0" by detecting the value of this cell current.

Figure 15:
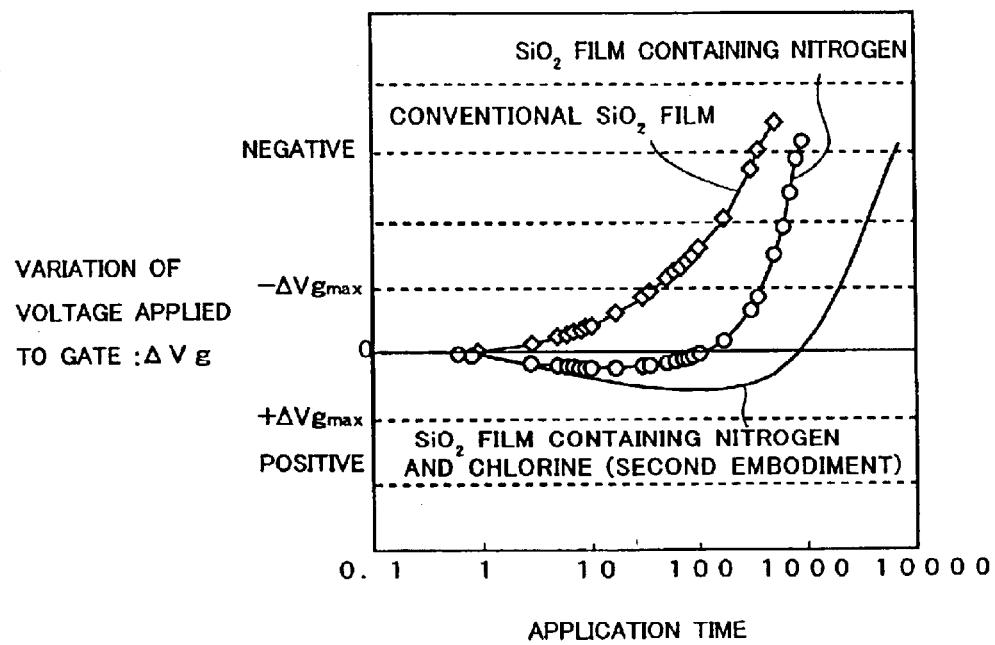
FIGS. 15 and 16 are characteristic diagrams for illustrating effects of the flash memory according to the second embodiment shown in FIG. 14.
Figure 16:
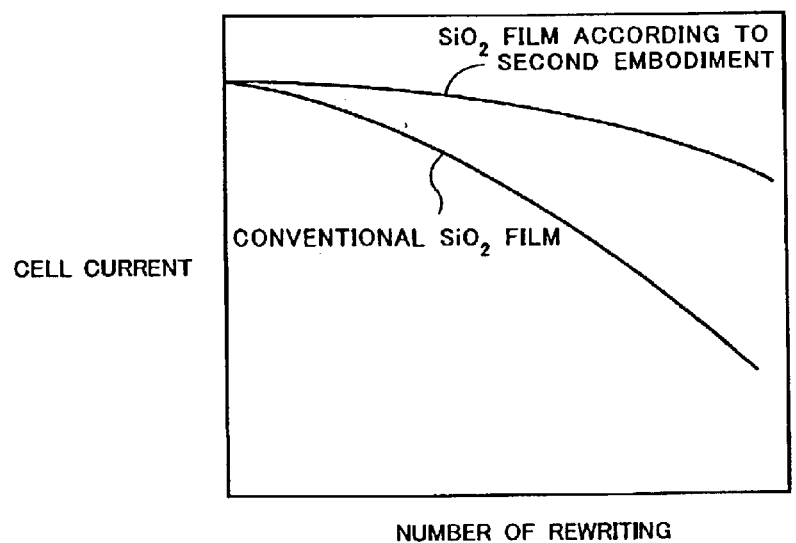

FIG. 15 is a characteristic diagram showing relations between voltage application times and threshold voltages in a memory cell having a tunnel insulator film consisting of a conventional $SiO_2$ film containing no nitrogen and chlorine, a memory cell having a tunnel insulator film consisting of an $SiO_2$ film containing nitrogen introduced therein and the memory cell according to the second embodiment having the tunnel insulator film 24 consisting of the $SiO_2$ film containing nitrogen and chlorine introduced therein. FIG. 16 is a characteristic diagram showing variations of cell currents after rewriting data a plurality of times in the memory cell having the tunnel insulator film consisting of the conventional $SiO_2$ film containing no nitrogen and chlorine, the memory cell having the tunnel insulator film consisting of the $SiO_2$ film containing nitrogen introduced therein and the memory cell according to the second embodiment having the tunnel insulator film 24 consisting of the $SiO_2$ film containing nitrogen and chlorine introduced therein. An effect of the memory cell according to the second embodiment having the tunnel insulator film 24 consisting of the $SiO_2$ film containing nitrogen and chlorine introduced therein is now described with reference to FIGS. 15 and 16.

Referring to FIG. 15, electrons were continuously injected into the memory cell having the tunnel insulator film formed by the conventional $SiO_2$ film containing no nitrogen and chlorine, the memory cell having the tunnel insulator film formed by the $SiO_2$ film containing nitrogen introduced therein by about $5 \times 10^{20}$ atoms/cm$^3$ at the maximum and the memory cell according to the second embodiment having the tunnel insulator film 24 consisting of the $SiO_2$ film containing chlorine introduced therein by about $2 \times 10^{20}$ atoms/cm$^3$ at the maximum and nitrogen introduced therein by about $5 \times 10^{20}$ atoms/cm$^3$ at the maximum respectively. In this case, the potentials (gate potentials) of floating gate electrodes of these memory cells fluctuated as shown in FIG. 15. Referring to FIG. 15, symbol $\pm \Delta Vg_{max}$ denotes the maximum values of gate potential variations $\Delta Vg$ allowing data reading in the memory cells. It is understood that the memory cell according to the second embodiment having the tunnel insulator film 24 consisting of the $SiO_2$ film containing nitrogen and chlorine introduced therein exhibits the longest time for bringing the gate potential to the maximum value $-\Delta Vg_{max}$ in a negative sense, as shown in FIG. 15. This is because the memory cell according to the second embodiment exhibits the so-called turnaround effect, in which the gate potential fluctuates in a positive sense in an initial stage of electron injection into the tunnel insulator film 24 and thereafter gradually fluctuates to the negative sense following increase of the electron injection time. While the memory cell having the tunnel insulator consisting of the $SiO_2$ film containing only nitrogen introduced therein also exhibits this turnaround effect, a variation $\Delta Vg$ of the gate potential Vg moving in the positive sense is small as compared with the memory cell according to the second embodiment having the tunnel insulator film 24 consisting of the $SiO_2$ film containing nitrogen and chlorine introduced therein.

According to the second embodiment, as hereinabove described, chlorine and nitrogen are so introduced into the tunnel insulator film 24 that the gate potential fluctuates in the positive sense in the initial stage of electron injection into the tunnel insulator film 24 and thereafter gradually fluctuates in the negative sense following increase of the electron injection time due to the turnaround effect, whereby the variation $\Delta Vg$ of the gate potential can be reduced after a lapse of a prescribed time. In other words, electrons can be further easily extracted from the floating gate electrode 25 to the source region 22 in data erasing after the lapse of the prescribed time, whereby the number of electrons remaining in the floating gate electrode 25 can be reduced when erasing data (extracting electrons) after the lapse of the prescribed time. Thus, it is possible to relax such an inconvenience that the cell current is reduced in an erased state in data reading following increase of the number of electrons remaining in the floating gate electrode 25 (see FIG. 16). Therefore, it is possible to relax such an inconvenience that data is hard to determine due to reduction of the cell current in the erased state in reading after the lapse of the prescribed time, whereby the number of data rewriting can be increased. Consequently, the working life can be improved.

According to the second embodiment, as hereinabove described, nitrogen is introduced into the $SiO_2$ film forming the tunnel insulator film 24 in addition to chlorine, whereby nitrogen is so easily coupled with the dangling bonds of Si in the tunnel insulator film 24 that formation of electron traps can be further suppressed in the initial stage of electron injection into the tunnel insulator film 24.

Figure 27:
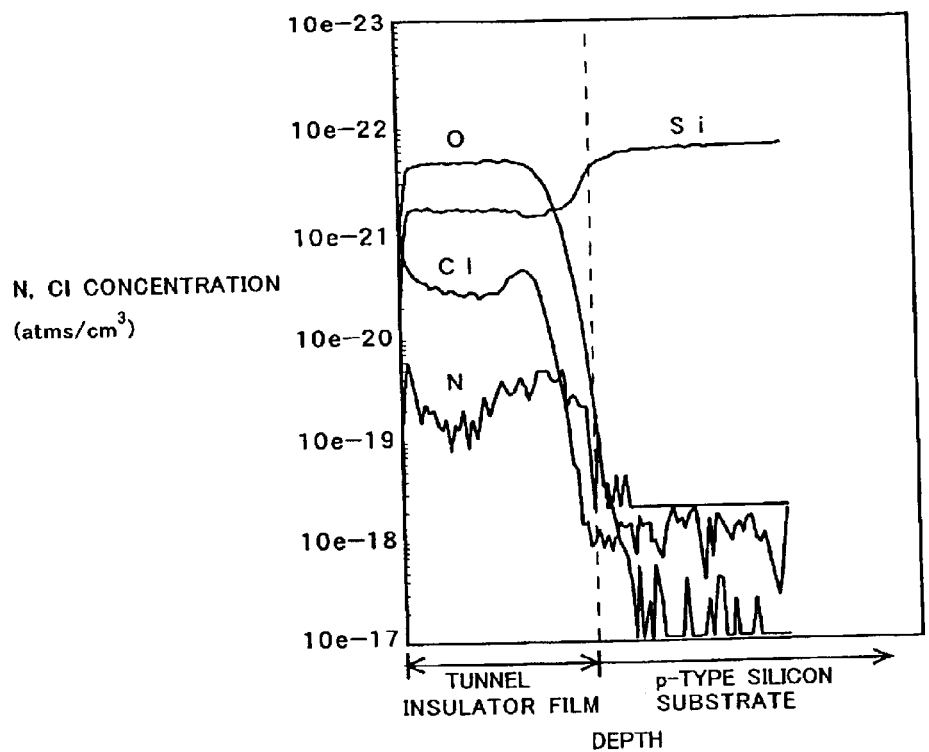
FIG. 27 is a characteristic diagram showing concentration profiles of Si, O, Cl and N immediately after deposition of a tunnel insulator film of the memory cell according to the second embodiment.
Figure 28:
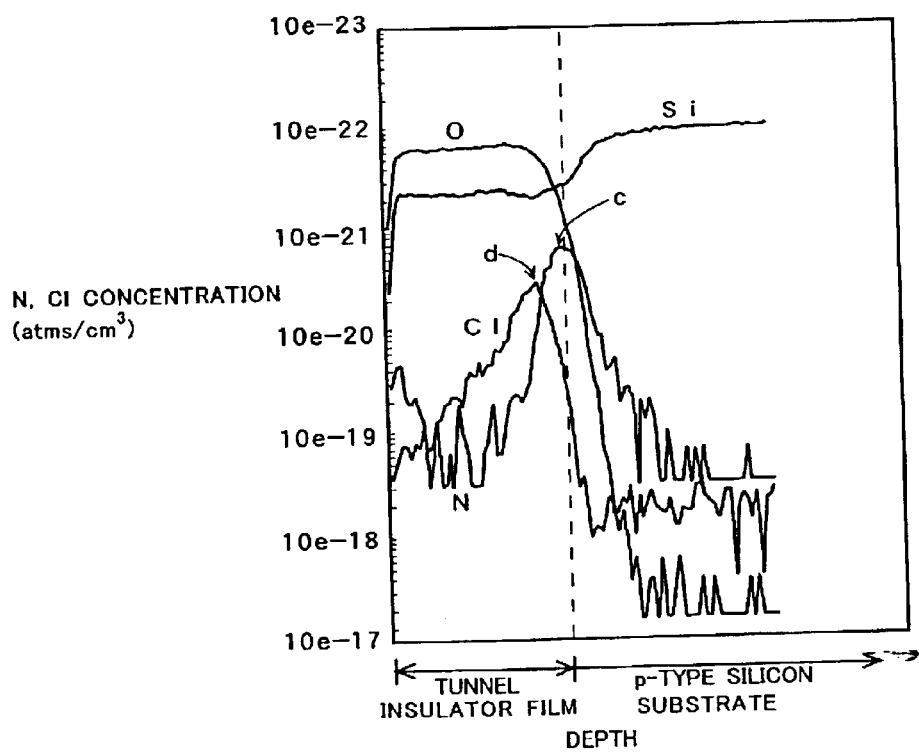
FIG. 28 is a characteristic diagram showing concentration profiles of Si, O, Cl and N after heat treatment performed on the tunnel insulator film of the memory cell according to the second embodiment.

FIGS. 17 to 20 show a fabrication process for the memory cell according to the second embodiment on a section along a plane rotated by 90° from that shown in FIG. 14, and FIGS. 21 to 26 show the fabrication process on the same section as that shown in FIG. 14. FIG. 27 is a characteristic diagram showing concentration profiles of Si, O, Cl and N immediately after deposition of the tunnel insulator film 24 of the memory cell according to the second embodiment. FIG. 28 is a characteristic diagram showing concentration profiles of Si, O, Cl and N after heat treatment performed on the tunnel insulator film 24 of the memory cell according to the second embodiment. The fabrication process for the memory cell of the flash memory according to the second embodiment is now described with reference to FIGS. 14 and 17 to 28.

Figure 17:
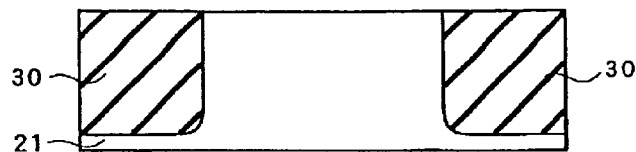
FIGS. 17 to 26 are sectional views for illustrating a fabrication process for the memory cell constituting the stacked gate flash memory according to the second embodiment shown in FIG. 14.

As shown in FIG. 17, insulator films 30 are formed on prescribed regions of the surface of the p-type silicon substrate 21 by STI, thereby isolating elements.

Figure 18:
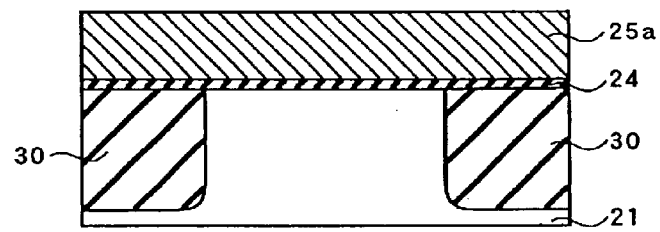

As shown in FIG. 18, the tunnel insulator film 24 consisting of the $SiO_2$ film containing chlorine and nitrogen introduced therein is formed on the p-type silicon substrate 21 with a thickness of about 8 nm to about 10 nm by thermal oxidation. More specifically, the tunnel insulator film 24 is formed under a condition of a substrate temperature of about 800° C. with introduced gas of 5 SLM to 10 SLM of oxygen and 10 sccm to 50 sccm of chlorine at a rate of about 1 nm/min. Thus, the tunnel insulator film 24 consisting of the $SiO_2$ film is formed with the concentration profiles shown in FIG. 27. Thereafter heat treatment is performed in an oxynitriding gas atmosphere of about 1000° C. for about 30 seconds by RTA, thereby densifying the tunnel insulator film 24 consisting of the $SiO_2$ film and further introducing nitrogen. According to the heat treatment performed in the oxynitriding gas atmosphere, the concentration profiles of the $SiO_2$ film constituting the tunnel insulator film 24 change to those shown in FIG. 28.

According to the second embodiment, the maximum chlorine concentration and the maximum nitrogen concentration in the $SiO_2$ film constituting the tunnel insulator film 24 are about $2 \times 10^{20}$ atoms/cm$^3$ and about $5 \times 10^{20}$ atoms/cm$^3$ respectively, as shown in FIG. 28. In the SiO₂ film constituting the tunnel insulator film 24, a peak position c maximizing the concentration profile of nitrogen is located closer to the interface between the tunnel insulator film 24 and the p-type silicon substrate 21 than a peak position d maximizing the concentration profile of chlorine.

According to the second embodiment, as hereinabove described, the tunnel insulator film 24 is so formed that the peak position c maximizing the concentration profile of nitrogen is located closer to the interface between the tunnel insulator film 24 and the p-type silicon substrate 21 than the peak position d maximizing the concentration profile of chlorine, whereby SiN bonds hardly uncoupled due to strong bond energy with Si can be formed in the vicinity of the interface and formation of electron traps can be further suppressed in the initial stage of electron injection into the tunnel insulator film 24.

As shown in FIG. 18, a polysilicon film 25a is deposited on the tunnel insulator film 24 consisting of the SiO₂ film with a thickness of about 100 nm. Phosphorus is ion-implanted from above the upper surface of the polysilicon film 25a so that the polysilicon film 25a has phosphorus concentration of about 5×10¹⁹ atoms/cm³, thereby providing the polysilicon film 25a with conductivity.

Figure 19:
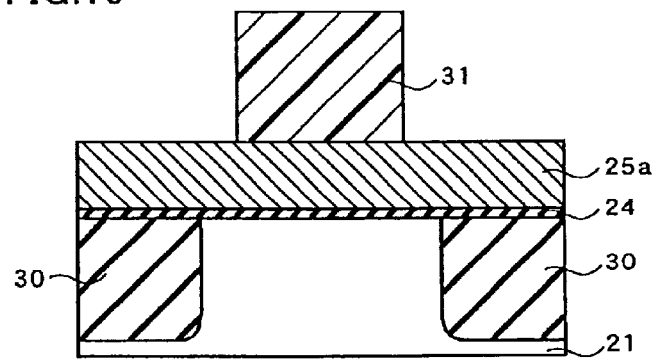

As shown in FIG. 19, a striped resist film 31 extending perpendicularly to the plane of FIG. 19 is formed on a prescribed region of the polysilicon film 25a by photolithography. The resist film 31 is employed as a mask for selectively etching and patterning the polysilicon film 25a by RIE, thereby forming a striped polysilicon film 25b shown in FIG. 20 to extend perpendicularly to the plane of FIG. 20. The resist film 31 is thereafter removed.

Figure 20:
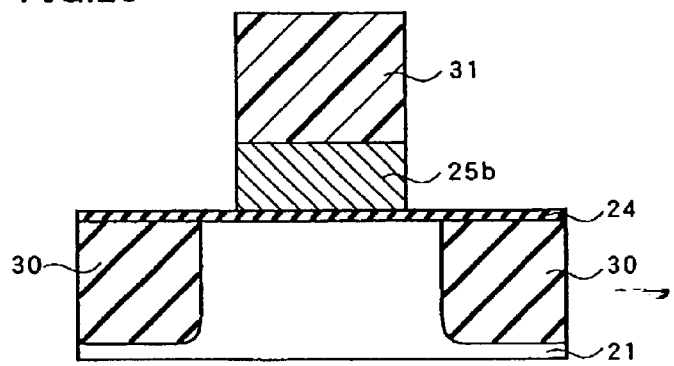
Figure 21:
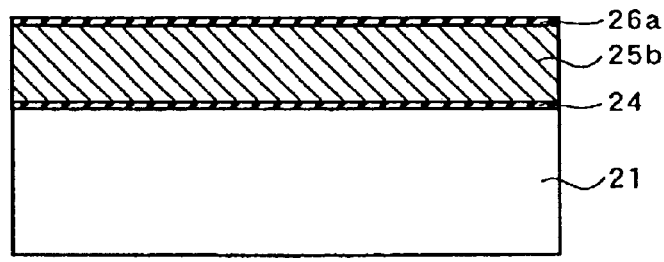

Referring to FIGS. 21 to 26, steps following that shown in FIG. 20 are described with reference to the section different from that shown in FIGS. 17 to 20 by 90°. After the step shown in FIG. 20, an SiO₂ film 26a is formed on the upper surface of the polysilicon film 25b with a thickness of about 15 nm by thermal oxidation, as shown in FIG. 21.

Figure 22:
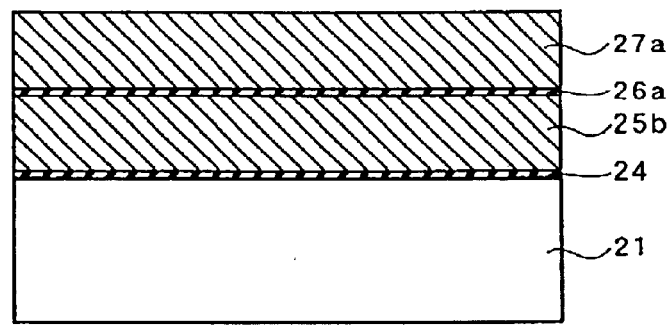

As shown in FIG. 22, a polysilicon film 27a is deposited on the SiO₂ film 26a, and thereafter phosphorus is ion-implanted from above the upper surface of the polysilicon film 27a for providing conductivity.

Figure 23:
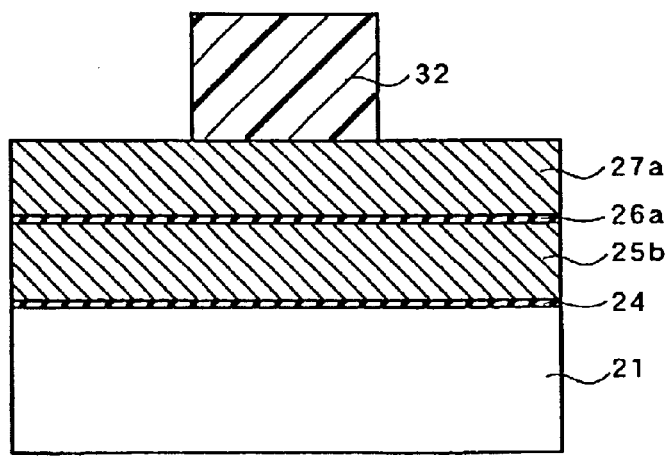

As shown in FIG. 23, a resist film 32 is formed on a prescribed region of the polysilicon film 27a by photolithography.

Figure 24:
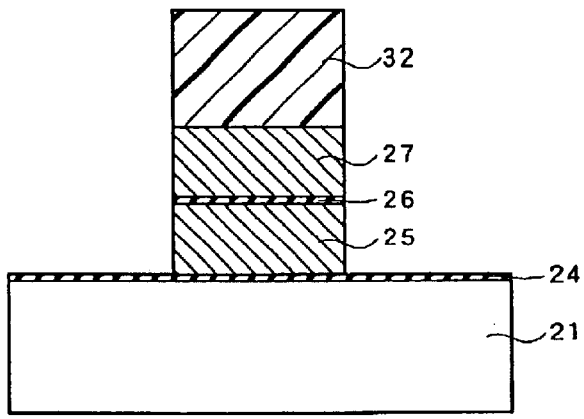

The resist film 32 is employed as a mask for selectively etching and patterning the polysilicon film 27a, the SiO₂ film 26a and the polysilicon film 25b, thereby forming the floating gate electrode 25, the gate insulator film 26 and the control gate electrode 27 as shown in FIG. 24. The resist film 32 is thereafter removed.

Figure 25:
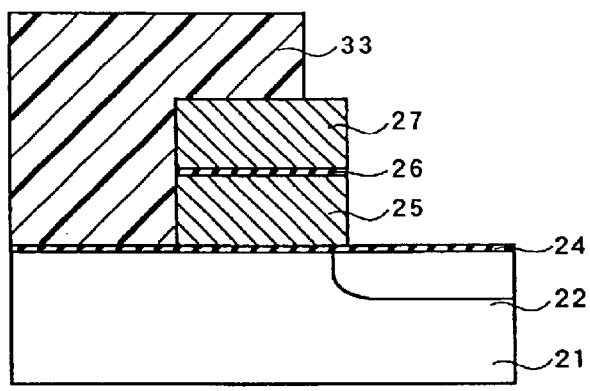

As shown in FIG. 25, an ion implantation mask layer 33 is formed to cover a region other than that for forming the source region 22. The ion implantation mask layer 33 is employed as a mask for ion-implanting phosphorus into the p-type silicon substrate 21 under conditions of implantation energy of about 40 keV and a dose of about 1×10¹⁵ to about 4×10¹⁵ atoms/cm², thereby forming the n-type source region 22. The ion implantation mask layer 33 is thereafter removed.

Figure 26:
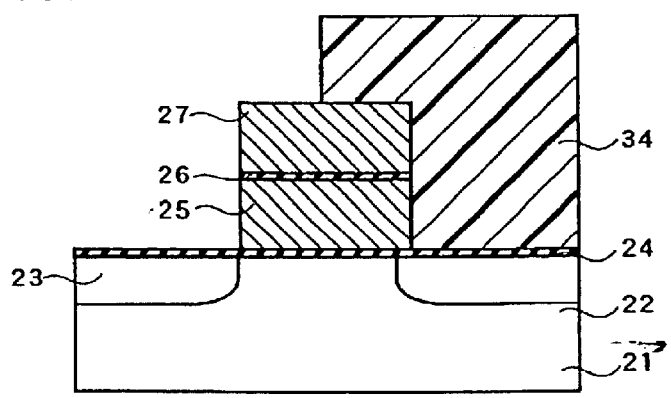

As shown in FIG. 26, another ion implantation mask layer 34 is formed to cover a region other than that for forming the drain region 23. The ion implantation mask layer 34 is employed as a mask for ion-implanting arsenic into the p-type silicon substrate 21 under conditions of implantation energy of about 60 keV and a dose of about 1×10¹⁵ to about 4×10¹⁵ atoms/cm⁻², thereby forming the n-type drain region 23. The ion implantation mask layer 34 is thereafter removed. Thus, the stacked gate flash memory according to the second embodiment including the memory cell shown in FIG. 14 is completed.

(Third Embodiment)

Figure 29:
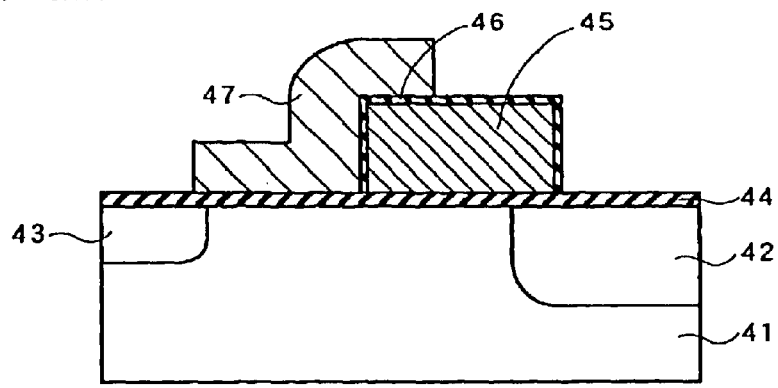
FIG. 29 is a sectional view showing a memory cell constituting a split gate flash memory (semiconductor device) according to a third embodiment of the present invention.

Referring to FIG. 29, a split gate flash memory according to a third embodiment of the present invention is described with reference to an SiO₂ film, constituting a tunnel insulator film, containing chlorine and nitrogen introduced therein.

The structure of each memory cell forming the split gate flash memory according to the third embodiment is described with reference to FIG. 29. According to the third embodiment, n-type source and drain regions 42 and 43 are formed on the surface of a p-type silicon substrate 41 at a prescribed interval, as shown in FIG. 29. A gate insulator film 44 consisting of an SiO₂ film having a thickness of about 10 nm to about 15 nm is formed on the upper surface of the p-type silicon substrate 41. A floating gate electrode 45 of polysilicon doped with phosphorus having a thickness of about 100 nm is formed on a portion of the gate insulator film 44 located between the source and drain regions 42 and 43. This floating gate electrode 45 is formed to overlap with the source region 42.

According to the third embodiment, a tunnel insulator film 46 having a thickness of about 8 nm to about 10 nm and consisting of an SiO₂ film (silicon oxide film) containing chlorine and nitrogen introduced therein is formed to cover the upper surface and a side surface of the floating gate electrode 45. A control gate electrode 47 of polysilicon doped with phosphorus is formed on a portion of the gate insulator film 44 located between the source and drain regions 42 and 43 while partially covering the upper surface of the floating gate electrode 45. The floating gate electrode 45 is an example of the "first conductive layer" in the present invention, and the control gate electrode 47 is an example of the "second conductive layer" in the present invention. The tunnel insulator film 46 is an example of the "silicon oxide film" in the present invention.

Concentration profiles of O, Si, N and Cl in the tunnel insulator film 46 according to the third embodiment are similar to those of the second embodiment shown in FIG. 28.

An operation of the memory cell according to the third embodiment is now described. Table 2 shows voltages applied to the drain region 43, the source region 42 and the control gate electrode 47 of the memory cell respectively in operation.

TABLE 2

|  | Control Gate Electrode | Drain Region | Source Region |
| --- | --- | --- | --- |
| Reading | 2.5 V~5 V | 0.5 V~1.0 V | GND |
| Writing | 1.5 V~3 V | 0.3 V~1.0 V | 8 V~10 V |
| Erasing | 9 V~14 V | GND | GND |

Referring to Table 2, the voltage of 1.5 V to 3 V is applied to the control gate electrode 47, and the voltages of 0.3 V to 1.0 V and 8 V to 10 V are applied to the drain region 43 and the source region 42 respectively in order to write data in the memory cell of the split gate flash memory. Thus, hot electrons flowing in a channel region of the p-type semiconductor substrate 41 are injected into the floating gate electrode 45, thereby writing the data. In order to erase data, the voltage of 9 V to 14 V is applied to the control gate electrode 47, and the source and drain regions 42 and 43 are set to a ground potential GND, as shown in Table 2. Thus, an F-N tunnel current flows from the control gate electrode 47 toward the floating gate electrode 45. In other words, electrons stored in the floating gate electrode 45 are extracted to the control gate electrode 47 through the tunnel insulator film 46, thereby erasing the data. In order to read data, the voltage of 2.5 V to 5 V is applied to the control gate electrode 47, the source region 42 is set to the ground voltage GND and the voltage of 0.5 V to 1.0 V is applied to the drain region 43, as shown in Table 2. A cell current varies with presence/absence of electrons stored in the floating gate electrode 45. Therefore, the flash memory determines whether or not the data is "1" or "0" by detecting the value of this cell current.

According to the third embodiment, as hereinabove described, chlorine and nitrogen are so introduced into the tunnel insulator film 46 located between the control gate electrode 47 and the floating gate electrode 45 that the gate potential fluctuates in the positive sense in the initial stage of electron injection into the tunnel insulator film 46 and thereafter gradually fluctuates in the negative sense following increase of the electron injection time due to the turnaround effect similarly to that according to the second embodiment shown in FIG. 15, whereby a variation $\Delta Vg$ of the gate potential can be reduced after a lapse of a prescribed time. In other words, electrons can be further easily extracted from the floating gate electrode 45 to the control gate electrode 47 in data erasing after the lapse of the prescribed time, whereby the number of electrons remaining in the floating gate electrode 45 can be reduced when erasing data (extracting electrons) after the lapse of the prescribed time. Thus, it is possible to relax such an inconvenience that the cell current is reduced in an erased state in data reading following increase of the number of electrons remaining in the floating gate electrode 45, similarly to the second embodiment (see FIG. 16). Therefore, it is possible to relax such an inconvenience that data is hard to determine due to reduction of the cell current in the erased state in reading after the lapse of the prescribed time, whereby the number of data rewriting can be increased. Consequently, the working life can be improved.

The remaining effects of the memory cell constituting the flash memory according to the third embodiment are similar to those of the second embodiment.

A fabrication process for the flash memory according to the third embodiment is now described with reference to FIGS. 29 to 39.

Figure 30:
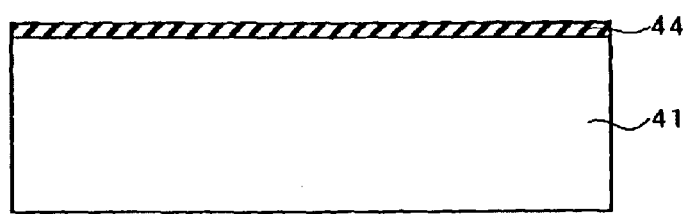
FIGS. 30 to 39 are sectional views for illustrating a fabrication process for a memory cell of the split gate flash memory according to the third embodiment shown in FIG. 29.

As shown in FIG. 30, the gate insulator film 44 consisting of an $SiO_2$ film having a thickness of about 10 nm to about 15 nm is formed on the p-type silicon substrate 41 by thermal oxidation.

Figure 31:
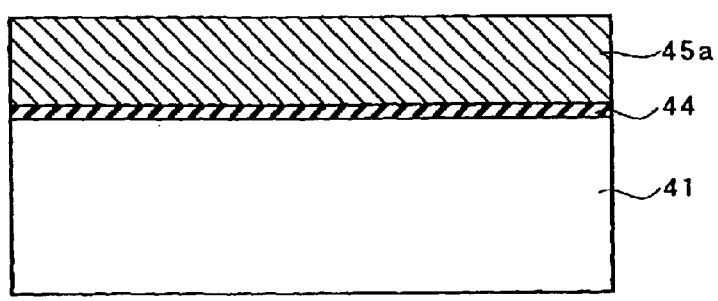

As shown in FIG. 31, a polysilicon film 45a is deposited on the gate insulator film 44 with a thickness of about 100 nm, and phosphorus is thereafter ion-implanted so that the polysilicon film 45a has phosphorus concentration of about $5\times10^{19}$ atoms/cm$^3$, thereby providing conductivity.

Figure 32:
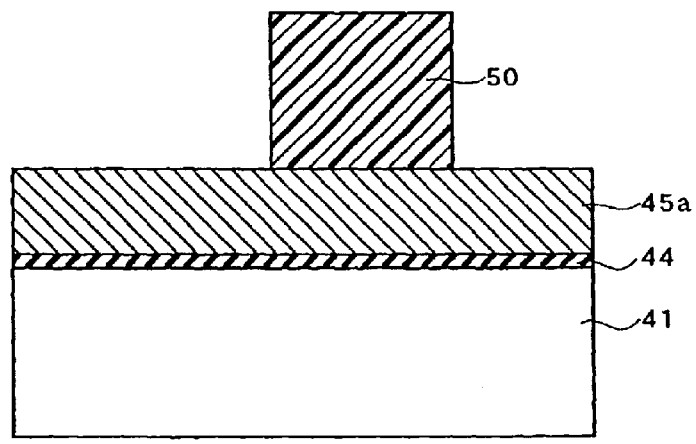

As shown in FIG. 32, a resist film 50 is formed on a prescribed region of the polysilicon film 45a by photolithography.

Figure 33:
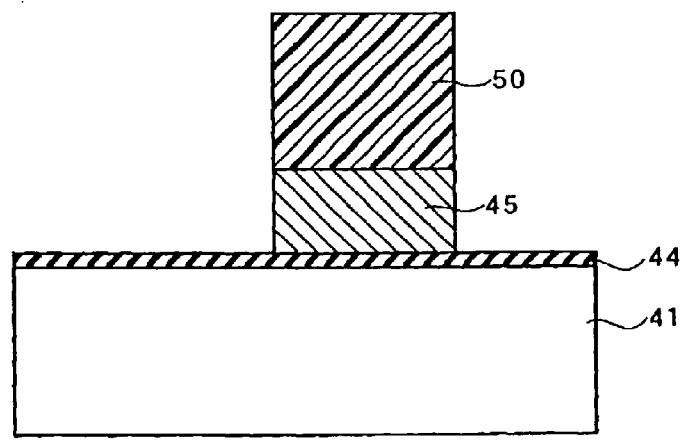

Thereafter the resist film 50 is employed as a mask for selectively etching and patterning the polysilicon film 45a by RIE, thereby forming the floating gate electrode 45 as shown in FIG. 33. The resist film 50 is thereafter removed.

Figure 34:
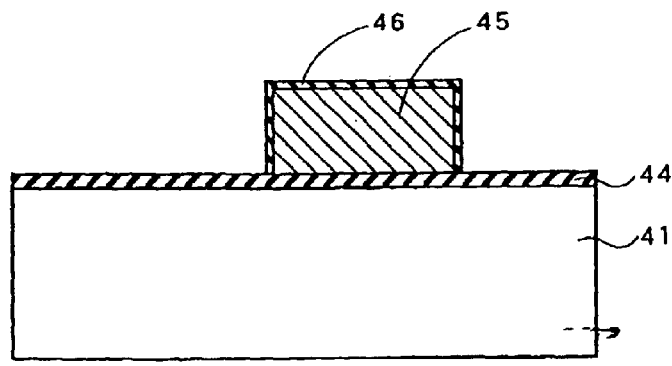

As shown in FIG. 34, the tunnel insulator film 46 consisting of an $SiO_2$ film containing chlorine and nitrogen introduced therein is formed to cover the upper surface and the side surfaces of the floating gate electrode 45 with a thickness of about 8 nm to about 10 nm by low-pressure CVD. More specifically, the tunnel insulator film 46 is deposited under conditions of a pressure of 133×10 Pa and a substrate temperature of about 800° C. with material gas of 10 sccm to 20 sccm of dichlorosilane gas and 0.5 SLM to 1.0 SLM of $N_2O$ gas at a deposition rate of about 1 nm/min. Thus, the tunnel insulator film 46 consisting of $SiO_2$ is formed with concentration profiles similar to those in the second embodiment shown in FIG. 27. Thereafter heat treatment is performed in an oxynitriding gas atmosphere of about 1000° C. for about 30 seconds by RTA, thereby densifying the tunnel insulator film 46 consisting of $SiO_2$ and further introducing nitrogen. According to the heat treatment performed in the oxynitriding gas atmosphere, the concentration profiles of the $SiO_2$ film constituting the tunnel insulator film 46 change similarly to those in the second embodiment shown in FIG. 13.

According to the third embodiment, the maximum chlorine concentration and the maximum nitrogen concentration in the $SiO_2$ film constituting the tunnel insulator film 46 are about $2\times10^{20}$ atoms/cm$^3$ and about $5\times10^{20}$ atoms/cm$^3$ respectively, similar to the second embodiment shown in FIG. 28. In the $SiO_2$ film constituting the tunnel insulator film 46, a peak position maximizing the concentration profile of nitrogen is located closer to the interface between the tunnel insulator film 46 and the floating gate electrode 45 than a peak position maximizing the concentration profile of chlorine.

According to the third embodiment, the tunnel insulator film 46 is so formed that the peak position maximizing the concentration profile of nitrogen is located closer to the interface between the tunnel insulator film 46 and the floating gate electrode 45 than the peak position maximizing the concentration profile of chlorine similarly to the second embodiment, whereby SiN bonds hardly uncoupled due to strong bond energy with Si can be formed in the vicinity of the interface and formation of electron traps can be further suppressed in the initial stage of electron injection into the tunnel insulator film 46.

Figure 35:
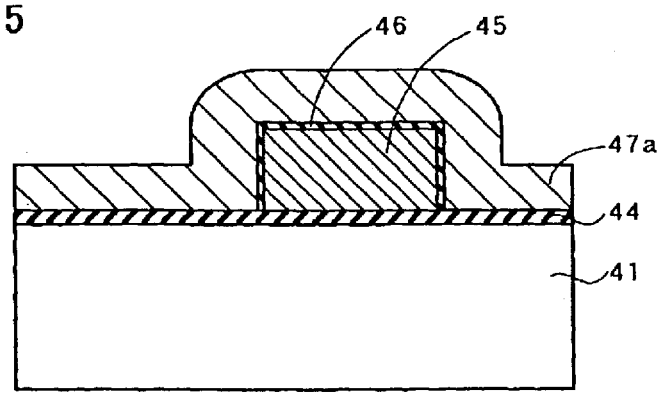

As shown in FIG. 35, a polysilicon film 47a is deposited to cover the overall upper surfaces of the gate insulator film 44 and the tunnel insulator film 46, and thereafter phosphorus is ion-implanted into the polysilicon film 47a for providing conductivity.

Figure 36:
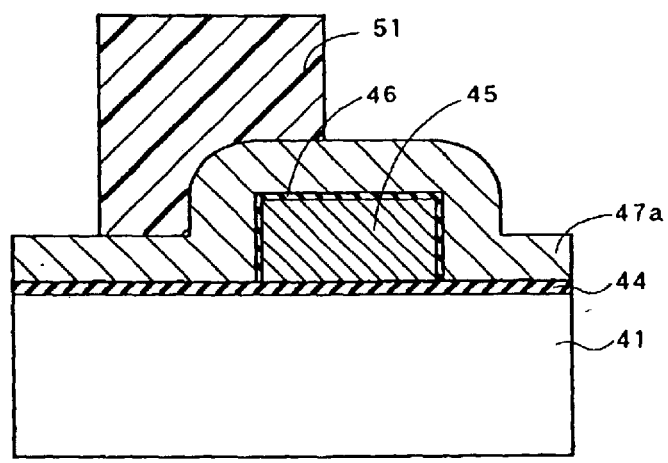
Figure 37:
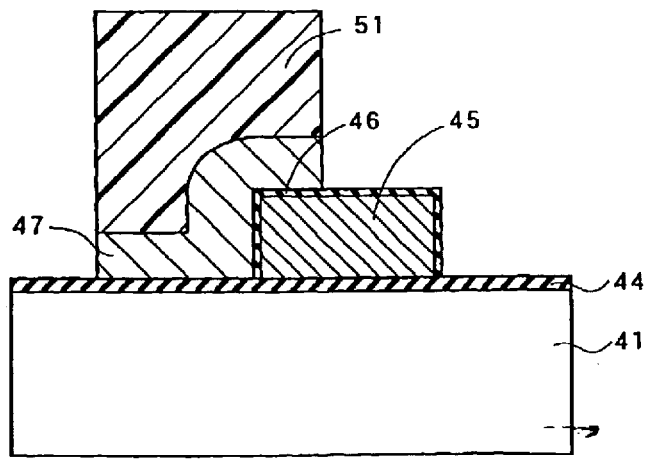

As shown in FIG. 36, a resist film 51 is formed on a prescribed region of the polysilicon film 47a by photolithography. The resist film 51 is thereafter employed as a mask for selectively etching the polysilicon film 47a by RIE, thereby forming the control gate electrode 47 having the shape shown in FIG. 37. The resist film 51 is thereafter removed.

Figure 38:
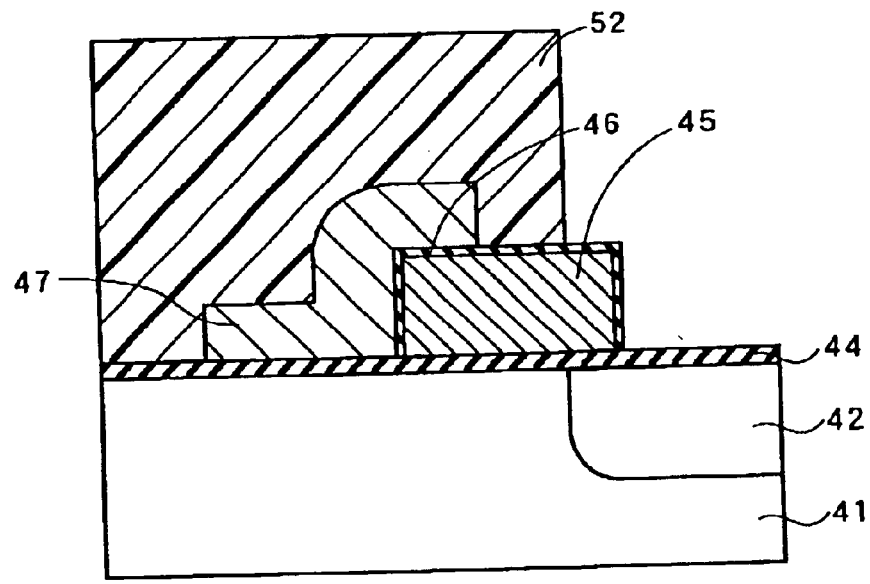

As shown in FIG. 38, an ion implantation mask layer 52 is formed to cover a region other than that for forming the source region 42 by photolithography. The ion implantation mask layer 52 is employed as a mask for ion-implanting phosphorus into the p-type silicon substrate 41 under conditions of implantation energy of about 40 keV and a dose of about $1\times10^{15}$ to about $4\times10^{15}$ atoms/cm$^{-2}$, thereby forming the n-type source region 42. The ion implantation mask layer 52 is thereafter removed.

Figure 39:
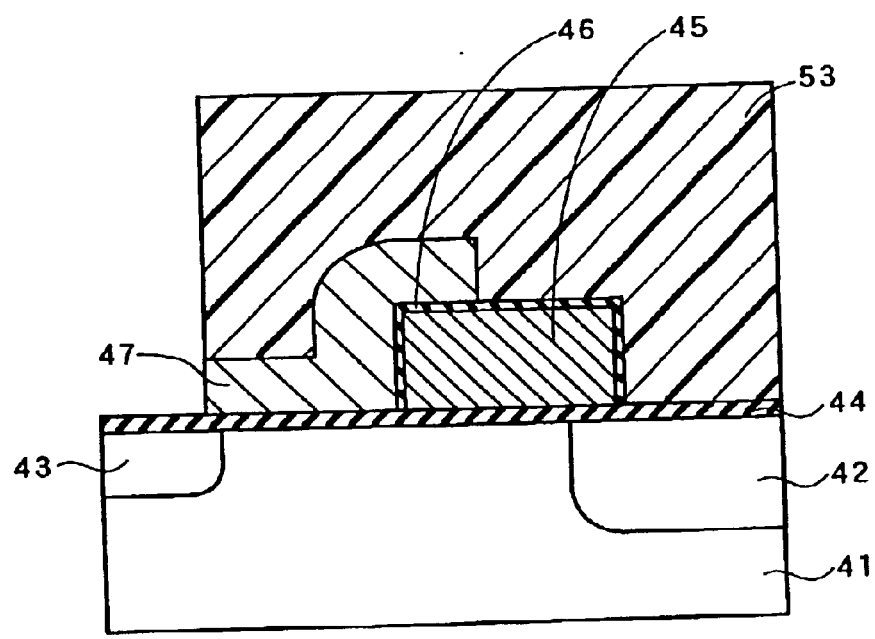

As shown in FIG. 39, another ion implantation mask layer 53 is formed to cover a region other than that for forming the drain region 43. The ion implantation mask layer 53 is employed as a mask for ion-implanting arsenic into the p-type silicon substrate 41 under conditions of implantation energy of about 60 keV and a dose of about $1\times10^{15}$ to about $4\times10^{15}$ atoms/cm$^{-2}$, thereby forming the n-type drain region 43. The ion implantation mask layer 53 is thereafter removed. Thus, the split gate flash memory according to the third embodiment including the memory cell shown in FIG. 29 is completed.

Although the present invention has been described and illustrated in detail, it is clearly understood that the same is by way of illustration and example only and is not to be taken by way of limitation, the spirit and scope of the present invention being limited only by the terms of the appended claims.

For example, while chlorine and nitrogen are introduced into the SiO$_2$ film (silicon oxide film) constituting the gate insulator film or the tunnel insulator film in each of the aforementioned first to third embodiments, the present invention is not restricted to this but only chlorine may be introduced into the SiO$_2$ film (silicon oxide film) constituting the gate insulator film or the tunnel insulator film. A similar effect can be attained also in this case.

While each of the first to third embodiments has been described with reference to a voltage-resistant transistor or a flash memory having an SiO$_2$ film (silicon oxide film), the present invention is not restricted to this but is also applicable to another semiconductor device having an insulator film consisting of an SiO$_2$ film (silicon oxide film).

While the maximum value of the nitrogen concentration in the SiO$_2$ film (silicon oxide film) constituting the gate insulator film or the tunnel insulator film is set to about $5\times10^{20}$ atoms/cm$^3$ in each of the aforementioned first to third embodiments, the present invention is not restricted to this but a similar effect can be attained with nitrogen concentration of at least $1\times10^{20}$ atoms/cm$^3$.

While the maximum value of the chlorine concentration in the gate insulator film or the tunnel insulator film consisting of the SiO$_2$ film (silicon oxide film) is set to about $2\times10^{20}$ atoms/cm$^3$ in each of the aforementioned first to third embodiments, the present invention is not restricted to this but the chlorine concentration in the SiO$_2$ film (silicon oxide film) may be in the range of at least $1\times10^{19}$ atoms/cm$^3$ and not more than $1\times10^{21}$ atoms/cm$^3$. In this case, the gate insulator film or the tunnel insulator film can be inhibited from formation of electron traps in the initial stage of electron injection, and a large number of holes can be formed. Further, the gate insulator film or the tunnel insulator film can be inhibited from reduction in quality resulting from introduction of excess chlorine.

While dichlorosilane gas and N$_2$O gas are employed as the material gas for the gate insulator film or the tunnel insulator film consisting of the SiO$_2$ film (silicon oxide film) in each of the aforementioned first and third embodiments, the present invention is not restricted to this but another material gas may alternatively be employed. For example, a gas mixture prepared by adding chlorine to monosilane gas may be employed. Alternatively, a gas mixture of silicon-containing gas and chlorine-containing gas may be employed.

While the gate insulator film or the tunnel insulator film consisting of the SiO$_2$ film (silicon oxide film) is heat-treated in the oxynitriding (N$_2$O) gas atmosphere for introducing nitrogen into the SiO$_2$ film (silicon oxide film) in each of the aforementioned first to third embodiments, the present invention is not restricted to this but another atmospheric gas may alternatively be employed. For example, NO gas or NH$_3$ gas may be employed. Alternatively, a gas mixture containing N$_2$O gas, NO gas and NH$_3$ gas may be employed.

While the impurity element is introduced by ion implantation for providing the polysilicon film with conductivity in each of the aforementioned first to third embodiments, the present invention is not restricted to this but the impurity element may alternatively be introduced by another method. For example, the impurity element may be introduced by diffusion employing POCL$_3$ gas.

While the first embodiment has been described with reference to a voltage-resistant transistor, the present invention is not restricted to this but may alternatively be applied to a general field-effect transistor.

What is claimed is:

1. A semiconductor device comprising:
   a first conductive layer;
   a second conductive layer; and
   a silicon oxide film, formed between said first conductive layer and said second conductive layer, containing chlorine introduced therein, wherein
   nitrogen is introduced into said silicon oxide film in concentration of at least $1\times10^{20}$ atoms/cm$^3$ in addition to said chlorine.

2. The semiconductor device according to claim 1, wherein the chlorine concentration in said silicon oxide film is at least $1\times10^{19}$ atoms/cm$^3$.

3. The semiconductor device according to claim 1, wherein
   the maximum chlorine concentration in said silicon oxide film is not more than $1\times10^{21}$ atoms/cm$^3$.

4. The semiconductor device according to claim 1, wherein
   the maximum value of the concentration profile of said chlorine introduced into said silicon oxide film is smaller than the concentration profile of said nitrogen introduced into said silicon oxide film.

5. The semiconductor device according to claim 1, wherein
   a position maximizing the concentration profile of said nitrogen introduced into said silicon oxide film is located to the interface between said silicon oxide film and said first conductive layer than a position maximizing the concentration profile of said chlorine introduced into said silicon oxide film.

6. The semiconductor device according to claim 5, wherein
   SiN is formed in the vicinity of the interface between said silicon oxide film and said first conductive layer.

7. The semiconductor device according to claim 5, wherein
   said position maximizing the concentration profile of said chlorine introduced into said silicon oxide film is located closer to the interface between said silicon oxide film and said first conductive layer than the central portion of said silicon oxide film along the thickness direction.

8. The semiconductor device according to claim 1, wherein
   a position maximizing the concentration profile of said nitrogen introduced into said silicon oxide film is located closer to the interface between said silicon oxide film and said second conductive layer than a position maximizing the concentration profile of said chlorine introduced into said silicon oxide film.

9. The semiconductor device according to claim 8, wherein
   SiN is formed in the vicinity of the interface between said silicon oxide film and said second conductive layer.

10. The semiconductor device according to claim 8, wherein said position maximizing the concentration profile of said chlorine introduced into said silicon oxide film is located closer to the interface between said silicon oxide film and said second conductive layer than the central portion of said silicon oxide film along the thickness direction.

11. The semiconductor device according to claim 1, wherein said silicon oxide film containing said chlorine introduced therein includes a tunnel insulator film of a nonvolatile memory.

12. The semiconductor device according to claim 11, wherein the potential of a floating gate fluctuates in a positive sense in an initial stage of electron injection into said tunnel insulator film, and the potential of said floating gate thereafter gradually fluctuates in a negative sense following increase of the time of electron injection into said tunnel insulator film.

13. The semiconductor device according to claim 11, wherein said nonvolatile memory includes a floating gate electrode formed on a semiconductor substrate and a control gate electrode formed on said floating gate electrode, and said tunnel insulator film including said silicon oxide film containing said chlorine introduced therein is arranged between said semiconductor substrate and said floating gate electrode.

14. The semiconductor device according to claim 11, wherein said nonvolatile memory includes a floating gate electrode formed on a semiconductor substrate and a control gate electrode formed to extend over said semiconductor substrate and said floating gate electrode, and said tunnel insulator film including said silicon oxide film containing said chlorine introduced therein is arranged between said floating gate electrode and said control gate electrode.

15. The semiconductor device according to claim 14, wherein the chlorine concentration in said silicon oxide film is at least $1\times10^{19}$ atoms/cm$^3$.

16. The semiconductor device according to claim 14, wherein the maximum chlorine concentration in said silicon oxide film is not more than $1\times10^{21}$ atoms/cm$^3$.

17. The semiconductor device according to claim 1, wherein said first conductive layer is a channel region of a field-effect transistor, said second conductive layer is a gate electrode of a field-effect transistor, and said silicon oxide film is a gate insulator film of a field-effect transistor.

18. The semiconductor device according to claim 17, wherein a threshold voltage fluctuates in a positive sense in an initial stage of electron injection into said gate insulator film, and said threshold voltage thereafter gradually fluctuates in a negative sense following increase of the time of electron injection into said gaze insulator film.

* * * * *